United States Patent
Hu

(10) Patent No.: US 12,100,677 B2
(45) Date of Patent: Sep. 24, 2024

(54) SEMICONDUCTOR STRUCTURE AND METHOD FOR FORMING SEMICONDUCTOR STRUCTURE, STACKED STRUCTURE, AND WAFER STACKING METHOD

(71) Applicant: CHANGXIN MEMORY TECHNOLOGIES, INC., Hefei (CN)

(72) Inventor: Hua Hu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 176 days.

(21) Appl. No.: 17/732,324

(22) Filed: Apr. 28, 2022

(65) Prior Publication Data

US 2023/0145031 A1  May 11, 2023

(30) Foreign Application Priority Data

Nov. 8, 2021 (CN) .......................... 202111312979.2

(51) Int. Cl.
*H01L 23/48* (2006.01)
*H01L 23/00* (2006.01)

(52) U.S. Cl.
CPC ............. *H01L 24/08* (2013.01); *H01L 24/03* (2013.01); *H01L 24/05* (2013.01); *H01L 24/80* (2013.01); *H01L 2224/03452* (2013.01); *H01L 2224/03614* (2013.01); *H01L 2224/03845* (2013.01); *H01L 2224/05073* (2013.01); *H01L 2224/05124* (2013.01); *H01L 2224/05147* (2013.01); *H01L 2224/05157* (2013.01); *H01L 2224/05184* (2013.01); *H01L 2224/05541* (2013.01); *H01L 2224/05551* (2013.01); *H01L 2224/05557* (2013.01); *H01L 2224/05576* (2013.01); *H01L 2224/05584* (2013.01); *H01L 2224/05624* (2013.01); *H01L 2224/05647* (2013.01); *H01L 2224/05657* (2013.01); *H01L 2224/05666* (2013.01); *H01L 2224/05681* (2013.01); *H01L 2224/05684* (2013.01); *H01L 2224/05687* (2013.01); *H01L 2224/08147* (2013.01);

(Continued)

(58) Field of Classification Search
CPC ..................... H01L 2224/03452–05124; H01L 2224/05541–05576; H01L 24/80; H01L 24/03–08

See application file for complete search history.

(56) References Cited

U.S. PATENT DOCUMENTS

| | | | | |
|---|---|---|---|---|
| 2003/0148618 A1* | 8/2003 | Parikh | ............... | H01L 21/76807 257/E21.507 |
| 2014/0131841 A1* | 5/2014 | Tseng | ..................... | H01L 23/528 438/626 |
| 2015/0318333 A1* | 11/2015 | Narayanan | ............ | H01L 27/101 257/4 |

FOREIGN PATENT DOCUMENTS

| | | |
|---|---|---|
| CN | 105513983 A | 4/2016 |
| CN | 111463114 B | 8/2021 |

* cited by examiner

*Primary Examiner* — Hoa B Trinh
(74) *Attorney, Agent, or Firm* — Kilpatrick Townsend & Stockton LLP

(57) ABSTRACT

A semiconductor structure, a method for forming a semiconductor structure, a stacked structure, and a wafer stacking method are provided. The semiconductor structure includes: a semiconductor substrate; a first dielectric layer on a surface of a semiconductor substrate; a top metal layer, in which the top metal layer is located in the first dielectric layer, and the top metal layer penetrates through the first dielectric layer; and a buffer layer located between the top metal layer and the first dielectric layer.

17 Claims, 13 Drawing Sheets

(52) U.S. Cl.
CPC ............... *H01L 2224/8012* (2013.01); *H01L 2224/80895* (2013.01); *H01L 2224/80896* (2013.01); *H01L 2924/35121* (2013.01)

SEMICONDUCTOR STRUCTURE AND METHOD FOR FORMING SEMICONDUCTOR STRUCTURE, STACKED STRUCTURE, AND WAFER STACKING METHOD

CROSS-REFERENCE TO RELATED APPLICATION

This application is filed based upon and claims priority to Chinese patent application No. 202111312979.2, filed on Nov. 8, 2021, the disclosure of which is hereby incorporated by reference in its entirety.

BACKGROUND

With the trend of highly integrated semiconductor development, multi-wafer stacking typically uses a hybrid bonding process to realize bonding between wafers. At present, a hybrid bonded copper bonding pad is manufactured by using a Damascene process. In order to ensure the bonding yield and electrical connection between wafers, a surface to be bonded is required to be planarized to a certain extent, and at the same time it is ensured that a height of a depression or protrusion of the copper bonding pad is 10 nanometers (nm) or less, or 5 nm or less, which has extremely high process difficulty.

In the related art, during a wafer stacking process, thermal expansion and diffusion of the copper bonding pad during bonding form a complete stacked structure. However, if the height of the protrusion or depression of the copper bonding pad is not controlled to be 10 nm or less, or 5 nm or less in the planarization process, a void may be formed between stacked interfaces of the wafers during the wafer bonding process, or the delamination between the wafers may occur, resulting in a bonding failure. In addition, a barrier layer located on the periphery of the bonding pad also breaks in the bonding process, thereby increasing the risk of electric leakage of the wafer stacked structure, and causing difficulty in narrowing of a bonding spacing.

SUMMARY

The disclosure relates to the technical field of semiconductors, and relates to, but is not limited to, a semiconductor structure, a method for forming a semiconductor structure, and a stacked structure.

In view of this, embodiments of the disclosure provide a semiconductor structure, a method for forming a semiconductor structure, and a stacked structure.

In a first aspect, the embodiments of the disclosure provide a semiconductor structure, including: a semiconductor substrate; a first dielectric layer on a surface of a semiconductor substrate; a top metal layer, in which the top metal layer is located in the first dielectric layer, and the top metal layer penetrates through the first dielectric layer; and a buffer layer located between the top metal layer and the first dielectric layer.

In a second aspect, the embodiments of the disclosure provide a method for manufacturing a semiconductor structure including the following operations.

A semiconductor substrate is provided, in which a first dielectric layer is formed on a surface of the semiconductor substrate, the first dielectric layer includes a first trench, and a depth of the first trench is less than a thickness of the first dielectric layer.

An initial buffer layer is formed on a surface of the first dielectric layer and an inner wall of the first trench.

A portion of the initial buffer layer and a portion of the first dielectric layer at a bottom of the first trench are removed to form a second trench penetrating through the first dielectric layer, and a buffer layer.

A metal material is filled in the first trench and the second trench to form a top metal layer.

In a third aspect, the embodiments of the disclosure provide a stacked structure including a first wafer and a second wafer stacked onto one another, in which each of the first wafer and the second wafer is at least provided with the semiconductor structure as described above.

The top metal layer of the first wafer is aligned with the top metal layer of the second wafer, the buffer layer of the first wafer is aligned with the buffer layer of the second wafer, and a bonding layer of the first wafer is aligned with a bonding layer of the second wafer.

In a fourth aspect, the embodiments of the disclosure provide a wafer stacking method including the following operations.

A first wafer and a second wafer each provided with the semiconductor structure as described above.

The first wafer is aligned with the second wafer to realize stacking of the first wafer and the second wafer.

BRIEF DESCRIPTION OF THE DRAWINGS

In the drawings (which are not necessarily to scale), similar reference numerals may denote similar components in different figures. The similar reference numerals having different letter suffixes may denote different examples of the similar components. The drawings generally illustrate various embodiments discussed in the disclosure by way of example and not by way of limitation.

DETAILED DESCRIPTION

Figure 1A:
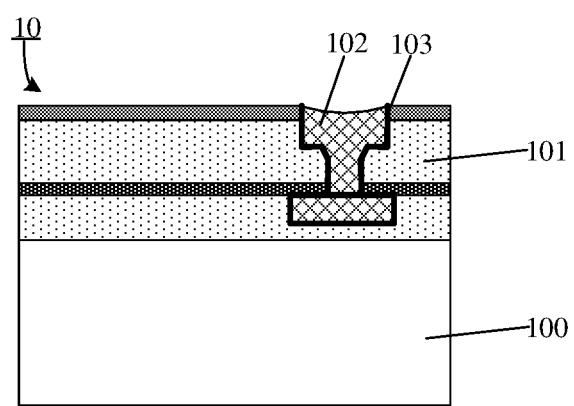
FIG. 1A is a schematic diagram of a semiconductor structure in the related art.

Exemplary implementations of the disclosure will be described in more detail below with reference to the accompanying drawings. Although the accompanying drawings illustrate the exemplary implementations of the disclosure, it should be understood that the disclosure can be implemented in multiple forms, and should not be limited by the particular implementations described here. On the contrary, the purpose of providing these implementations is to more thoroughly understand the disclosure, and the scope of the disclosure of the disclosure is fully conveyed to the persons skilled in the art.

In the following description, numerous specific details are given in order to provide a more thorough understanding of the disclosure. However, it will be apparent to the persons skilled in the art that the disclosure may be implemented without one or more of these details. In other examples, in order to avoid confusion with the disclosure, some technical features well known in the art are not described. That is, all the features of the actual embodiments are not described herein, and well-known functions and structures are not described in detail.

In the accompanying drawings, for clarity, the dimensions of layers, areas, elements and their relative dimensions may be exaggerated. The same reference numerals are used to denote the same components throughout the disclosure.

It should be understood that when an element or layer is referred to as being "on", "adjacent to", "connected to" or "coupled to" another element or layer, it can be directly on the another element or layer, adjacent, connected or coupled to the another element or layer, or intermediate elements or layers may be present. In contrast, when an element is referred to as being "directly on", "directly adjacent to", "directly connected to" or "directly coupled to" another element or layer, there are no intermediate elements or layers. It should be understood that although the terms, first, second, third, etc., are used to describe the elements, components, areas, layers and/or sections, these elements, components, areas, layers and/or sections should not be limited by these terms. These terms are merely used to distinguish one element, component, area, layer or section from another element, component, area, layer or section. Therefore, a first element, component, area, layer or section, which is discussed below, may be referred to as a second element, component, area, layer or section, without departing from the scope of the disclosure. Moreover, when a second element, component, area, layer or section is discussed, it does not mean that a first element, component, area, layer or second is necessarily present in the disclosure.

The terms used herein are for the purpose of describing particular embodiments only and is not intended to limit the disclosure. As used herein, the singular forms "a", "an" and "the/said" are intended to include the plural forms as well, unless the context clearly indicates otherwise. It should be further understood that the terms "consisting of" and/or "include", when used in this description, specify the presence of stated features, integers, operations, operations, elements, and/or components, but do not preclude the presence or addition of one or more other features, integers, operations, operations, elements, components, and/or groups thereof. As used herein, the term "and/or" includes any and all combinations of the associated listed items.

Before a semiconductor structure and a method for forming a semiconductor structure provided in embodiments of the disclosure are described in detail, a process for forming the semiconductor structure in the related art is first described.

Figure 1B:
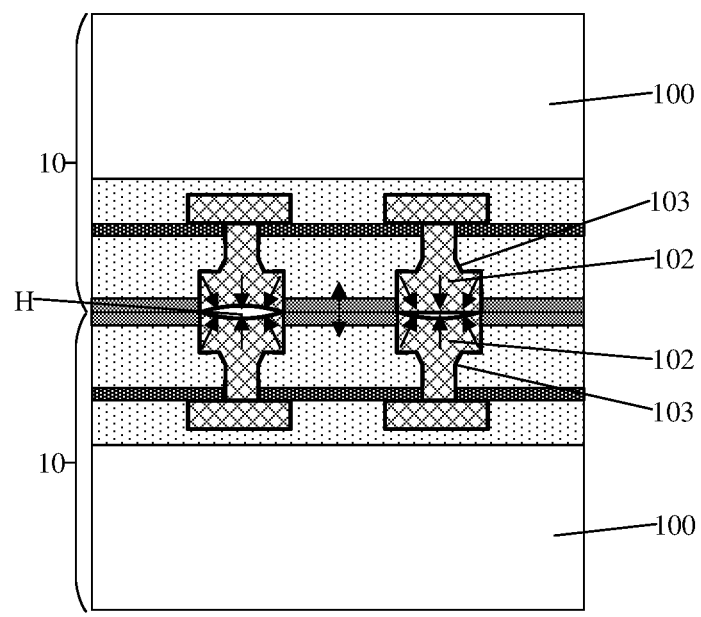
FIG. 1B is a schematic diagram of a semiconductor stacked structure in the related art.

FIG. 1A is a schematic diagram of a semiconductor structure in the related art. As shown in FIG. 1A, the semiconductor structure 10 in the related art includes a silicon substrate 100, a dielectric layer 101 located on a surface of the silicon substrate 100, a copper bonding key 102 located in the dielectric layer 101, and a barrier layer 103 located at a periphery of the copper bonding key 102. FIG. 1B is a schematic diagram of a semiconductor stacked structure in the related art. As shown in FIG. 1B, in the related art, two semiconductor structures 10 are stacked onto one another, and the stacking of the two semiconductor structures is realized through the copper bonding key 102 of each semiconductor structure.

However, at present, a hybrid bonded copper bonding pad is manufactured by using a Damascene process. In order to ensure the bonding yield and electrical connection between the semiconductor structures, a surface to be bonded is required to be planarized to a certain extent, and at the same time it is ensured that a height of a depression or protrusion of the copper bonding pad is 10 nm or less, or 5 nm or less, which has extremely high process difficulty. In the related art, during a semiconductor stacking process, thermal expansion and diffusion of the copper bonding pad during bonding form a complete stacked structure. However, if the height of the protrusion or depression of the copper bonding pad is not controlled to be 10 nm or less, or 5 nm or less in the planarization process, a void H (as shown in FIG. 1B) may be formed between stacked interfaces of the semiconductor structures during the bonding process of the semiconductor structures, or delamination between the semiconductor structures may occur in a direction shown by the arrow in FIG. 1B, resulting in a bonding failure. In addition, the barrier layer 103 also breaks in the bonding process, thereby increasing the risk of electric leakage of the semiconductor stacked structure, and causing difficulty in narrowing of a bonding spacing.

On the basis of the problem in the related art, the embodiments of the disclosure provide a semiconductor structure and a method for forming a semiconductor structure, a stacked structure, and a wafer stacking method. The semiconductor structure includes a top metal layer and a buffer layer. The top metal layer is located in a first dielectric layer on a surface of a semiconductor substrate, and the top metal layer penetrates through the first dielectric layer. The buffer layer is located between the top metal layer and the first dielectric layer. The semiconductor structure provided by the embodiments of the disclosure includes the buffer layer located between the top metal layer and the first dielectric layer, and the buffer layer can effectively adapt to transverse expansion caused by diffusion of the top metal layer in the bonding process of two semiconductor structures. Therefore, delamination between the semiconductor structures caused by excessively longitudinal expansion due to the limited transverse expansion of the top metal layer can be avoided.

Figure 2:
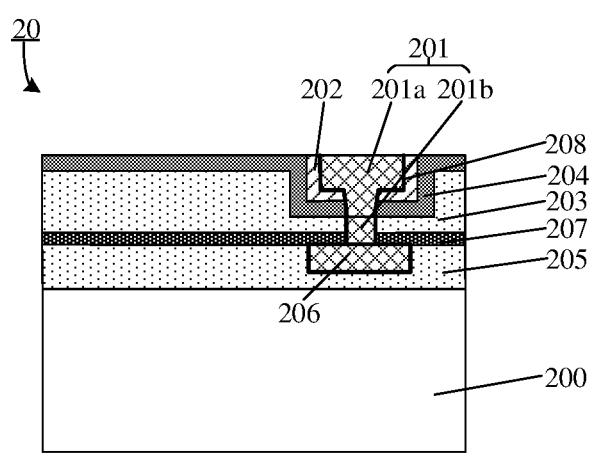
FIG. 2 is a schematic diagram of a semiconductor structure according to an embodiment of the disclosure.

The embodiments of the disclosure provide a semiconductor structure. FIG. 2 is a schematic diagram of a semiconductor structure according to an embodiment of the disclosure. As shown in FIG. 2, the semiconductor structure 20 includes a top metal layer 201 and a buffer layer 202.

The top metal layer 201 is located in a first dielectric layer 203 on a surface of a semiconductor substrate 200, and the top metal layer 201 penetrates through the first dielectric layer 203. The buffer layer 202 is located between the top metal layer 201 and the first dielectric layer 203.

The semiconductor substrate 200 may be a silicon substrate. The semiconductor substrate may also include other semiconductor elements, for example, germanium (Ge), or include semiconductor compounds, for example, silicon carbide (SiC), gallium arsenide (GaAs), gallium phosphide (GaP), indium phosphide (InP), indium arsenide (TnAs), or indium antimonide (InSb), or include other semiconductor alloys, for example, silicon germanium (SiGe), gallium arsenide phosphide (GaAsP), indium arsenide aluminum (AlInAs), gallium arsenide aluminum (AlGaAs), indium gallium arsenide (GaInAs), indium phosphide gallium (GaInP), and/or indium gallium arsenide phosphide (GaInAsP), or a combination thereof. The first dielectric layer 203 may include materials such as silicon dioxide and carbon doped silicon oxide. The top metal layer 201 includes a metal material, and the metal material may be at least one of tungsten (W), cobalt (Co), copper (Cu), or aluminum (Al), or a combination of at least two of these materials.

The buffer layer 202 includes a buffer material, and the buffer material includes at least one of an organic material, an inorganic material, or a composite material, or a combination of at least two of these materials. For example, the buffer material may be a material such as a mixture of polyimide (PI), benzocyclobutene (BCB), porous silicon oxide, an organic matter, and silicon oxide.

In the embodiments of the disclosure, the presence of the buffer layer provides a space to adapt to a transverse volume change of the top metal layer in the subsequent bonding process of the semiconductor structures, and prevents a bonding failure of the semiconductor structures due to delamination caused by excessively longitudinal expansion due to the limitation to the transverse volume change of the top metal layer.

In some embodiments, with reference to FIG. 2, the first dielectric layer 203 includes a first trench and a second trench communicating with each other, and an opening dimension of the first trench is greater than an opening dimension of the second trench. Correspondingly, the top metal layer 201 includes a first top metal layer 201a located in the first trench, and a second top metal layer 201b located in the second trench.

In the embodiments of the disclosure, the buffer layer 202 is located between the first top metal layer 201a and the corresponding first dielectric layer, and a top surface of the buffer layer 202 is flush with a top surface of the first top metal layer 201a.

In some embodiments, with reference to FIG. 2, the semiconductor structure 20 further includes a bonding layer 204. The bonding layer 204 is located between the buffer layer 202 and the first dielectric layer 203, and/or the bonding layer 204 is located between the top metal layer 201 and the buffer layer 202. The elastic modulus of the buffer layer 202 is less than the elastic modulus of the bonding layer 204, and the bonding strength of the buffer layer 202 is greater than the bonding strength of the bonding layer 204.

In the embodiments of the disclosure, the bonding layer having a blocking effect wraps the top metal layer, so that diffusion of the metal material in the top metal layer can be effectively prevented, and electric leakage of the semiconductor structure is avoided.

In some embodiments, the elastic modulus of the buffer layer is less than the elastic modulus of the bonding layer. That is to say, the buffer layer is more prone to deformation than the bonding layer. Therefore, the buffer layer is provided between the bonding layer and the top metal layer, thereby effectively adapting to a transverse volume change of the top metal layer, and preventing delamination caused by excessively longitudinal expansion due to the limitation to the transverse volume change of the top metal layer.

In some embodiments, the bonding strength of the buffer layer is greater than the bonding strength of the bonding layer. By providing the buffer layer between the bonding layer and the top metal layer, the bonding failure of the semiconductor structures can be prevented, and the bonding strength between the semiconductor structures can also be further improved.

In some embodiments, the bonding layer includes a bonding material. The bonding material includes at least one of silicon oxide, silicon nitride, silicon carbonitride, or silicon oxynitride, or a combination of at least two of these materials. For example, the bonding material may be silicon oxide, carbon doped silicon oxide, silicon nitride, or silicon oxynitride.

In some embodiments, with reference to FIG. 2, the semiconductor structure 20 further includes a second dielectric layer 205 on a surface of the semiconductor substrate 200 and a bottom metal layer 206 located in the second dielectric layer 205. The first dielectric layer 203 is located on the second dielectric layer 205. In the embodiments of the disclosure, the bottom metal layer 206 is connected to the second top metal layer 201b.

In some embodiments, with reference to FIG. 2, the semiconductor structure 20 further includes an etch stop layer 207 located between the first dielectric layer 203 and the second dielectric layer 205. The second trench penetrates through the etch stop layer 207.

In some embodiments, with reference to FIG. 2, the semiconductor structure 20 further includes a barrier layer 208, and the barrier layer 208 is located on an outer side wall and a bottom of the top metal layer 201. For example, the barrier layer 208 is located between the buffer layer 202 and the top metal layer 201, between the bonding layer 204 and the top metal layer 201, between the first dielectric layer 203 and the top metal layer 201, between the etch stop layer 207 and the second top metal layer 201b, and between the bottom metal layer 206 and the second dielectric layer 205.

The material of the barrier layer may be metal tantalum, tantalum nitride, metal titanium, and titanium nitride, etc.

In the embodiments of the disclosure, the barrier layer is configured to prevent electric leakage of the semiconductor structures caused by diffusion of the metal material filled in the first trench and the second trench.

The semiconductor structure provided by the embodiments of the disclosure includes the buffer layer located between the top metal layer and the first dielectric layer, and the buffer layer can effectively adapt to transverse expansion caused by diffusion of the top metal layer in the bonding process of the semiconductor structures. Therefore, delamination between the semiconductor structures caused by longitudinal expansion due to the limited transverse expansion of the top metal layer can be avoided.

Figure 3:
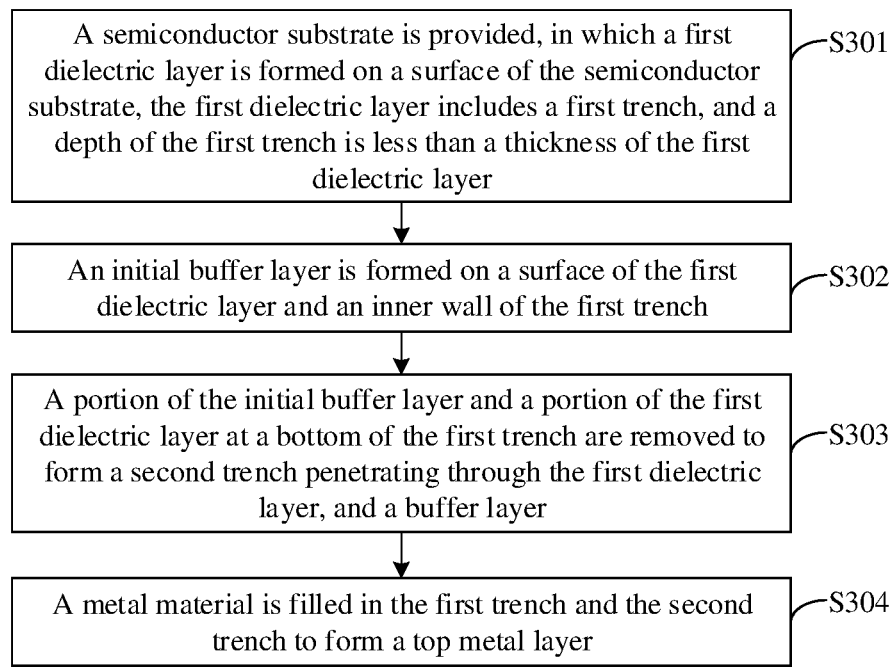
FIG. 3 is a schematic flowchart of a method for manufacturing a semiconductor structure according to an embodiment of the disclosure.

The embodiments of the disclosure provide a method for manufacturing a semiconductor structure. FIG. 3 is a schematic flowchart of a method for manufacturing a semiconductor structure according to an embodiment of the disclosure. As shown in FIG. 3, the method for manufacturing the semiconductor structure includes the following operations.

At S301, a semiconductor substrate is provided, in which a first dielectric layer is formed on a surface of the semiconductor substrate, the first dielectric layer includes a first trench, and a depth of the first trench is less than a thickness of the first dielectric layer.

In the embodiments of the disclosure, the semiconductor substrate may be a silicon substrate. The semiconductor substrate may also include other semiconductor compounds. The first dielectric layer may include materials such as silicon dioxide and carbon doped silicon oxide.

The first trench is located on a surface of the first dielectric layer, and the first trench does not penetrate the first dielectric layer.

At S302, an initial buffer layer is formed on a surface of the first dielectric layer and an inner wall of the first trench.

In the embodiments of the disclosure, the initial buffer layer includes a buffer material, and the buffer material includes at least one or any combination of an organic material, an inorganic material, or a composite material. For example, the buffer material may be a material such as a mixture of polyimide, benzocyclobutene, porous silicon oxide, an organic matter, and silicon oxide.

In the embodiments of the disclosure, the initial buffer layer may be formed by any suitable deposition process, for example, a chemical vapor deposition (CVD) process, a physical vapor deposition (PVD) process, an atomic layer deposition (ALD) process, a spin coating process, or a coating process.

At S303, a portion of the initial buffer layer and a portion of the first dielectric layer at a bottom of the first trench are removed to form a second trench penetrating through the first dielectric layer, and a buffer layer.

In the embodiments of the disclosure, a portion of the initial buffer layer and a portion of the first dielectric layer at the bottom of the first trench may be removed through a dry etching process, such as a plasma etching process, a reactive ion etching process, or an ion milling process, to form a second trench penetrating through the first dielectric layer, and a buffer layer.

At S304, a metal material is filled in the first trench and the second trench to form a top metal layer.

In the embodiments of the disclosure, the metal material of the top metal layer includes at least one or any combination of tungsten, cobalt, copper, or aluminum.

FIGS. 4A to 4G are schematic diagrams illustrating a process for manufacturing a semiconductor structure according to embodiments of the disclosure. Next, with reference to FIGS. 4A to 4G, the method for manufacturing the semiconductor structure according to an embodiment of the disclosure is further described in detail.

Figure 4A:
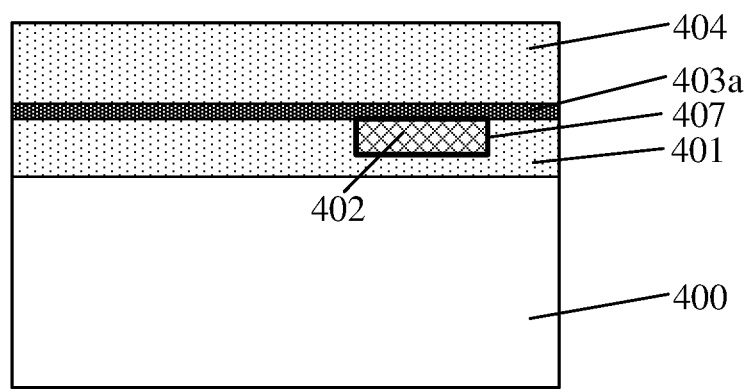
FIGS. 4A to 4G are schematic diagrams illustrating a process for manufacturing a semiconductor structure according to embodiments of the disclosure.
Figure 4B:
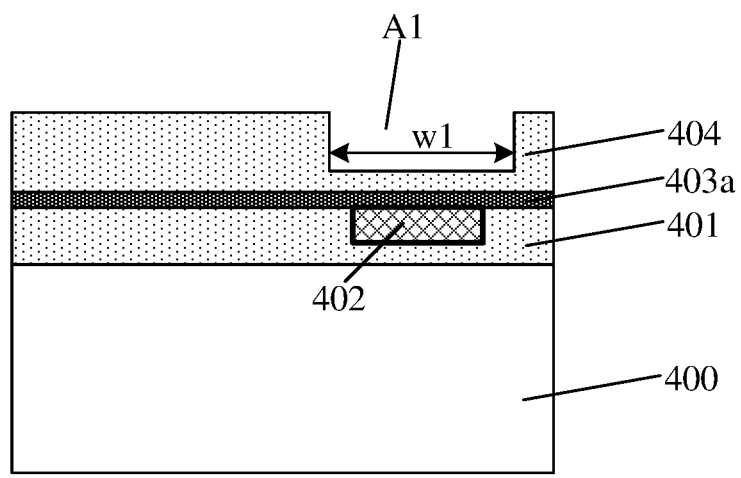

First, with reference to FIG. 4A and FIG. 4B, S301 is executed. At S301, a semiconductor substrate is provided, in which a first dielectric layer is formed on a surface of the semiconductor substrate, and the first dielectric layer includes a first trench.

In some embodiments, before the first dielectric layer is formed, the method for manufacturing the semiconductor structure includes the following operations.

At S10, a second dielectric layer is formed on a surface of the semiconductor substrate.

The second dielectric layer may include materials such as silicon dioxide and carbon doped silicon oxide. In the embodiments of the disclosure, the second dielectric layer may be formed by any suitable deposition process.

At S11, a bottom metal layer is formed in the second dielectric layer.

The bottom metal layer includes a metal material, and the metal material may be at least one or any combination of tungsten, cobalt, copper, or aluminum. In the embodiments of the disclosure, the second dielectric layer is etched to form a recess, and a metal material is filled in the recess to form a bottom metal layer located in the second dielectric layer. A top surface of the bottom metal layer is flush with a top surface of the second dielectric layer.

In some embodiments, before the metal material is filled in the formed recess to form the bottom metal layer, the method for manufacturing the semiconductor structure further includes the following operation. A barrier layer is formed on an inner wall of the recess. The barrier layer is configured to prevent the metal material of the bottom metal layer from diffusing into the second dielectric layer.

At S12, an initial etch stop layer is formed on a surface of the second dielectric layer and a surface of the bottom metal layer.

In the embodiments of the disclosure, the initial etch stop layer may be a silicon nitride layer or other material layers.

In some embodiments, after the initial etch stop layer is formed, the method for manufacturing the semiconductor structure includes the following operations.

At S13, a first dielectric layer is formed on a surface of the initial etch stop layer.

In the embodiments of the disclosure, the material of the second dielectric layer may be the same as or different from the material of the first dielectric layer.

As shown in FIG. 4A, a second dielectric layer 401 is formed on the surface of the semiconductor substrate 400, and a bottom metal layer 402 located in the second dielectric layer, a barrier layer 407 located between the bottom metal layer 402 and the second dielectric layer 401, an initial etch stop layer 403a located on surfaces of the second dielectric layer 401 and the bottom metal layer 402, and a first dielectric layer 404 located on a surface of the initial etch stop layer 403a are formed.

At S14, the first dielectric layer is etched to form a first trench.

In the embodiments of the disclosure, the first dielectric layer 404 may be etched by a dry etching process or a wet etching process to form a first trench A1 as shown in FIG. 4B, in which an opening dimension of the first trench A1 is w1.

Figure 4C:
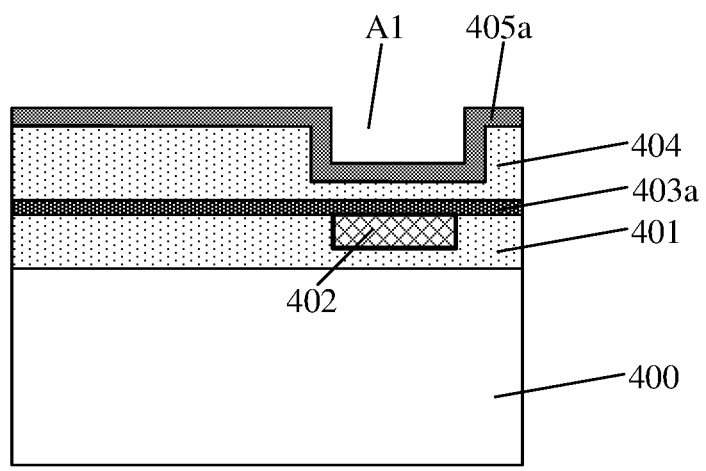
Figure 4D:
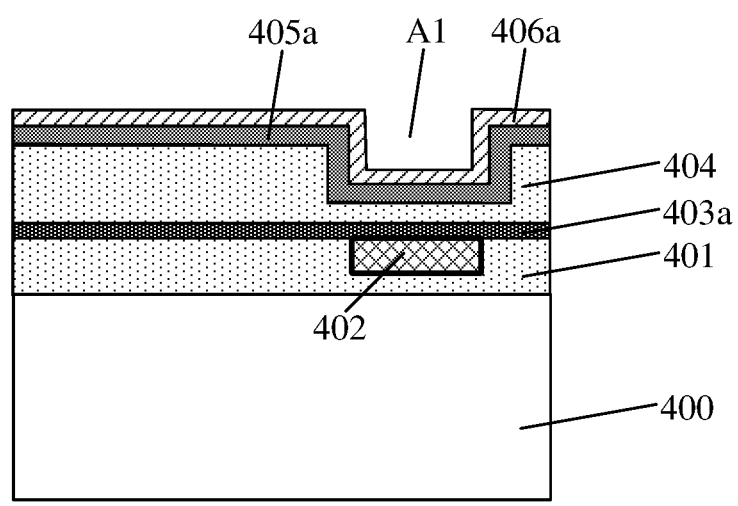

Next, with reference to FIG. 4C and FIG. 4D, S302 is executed. At S302, an initial buffer layer is formed on a surface of the first dielectric layer and an inner wall of the first trench.

In some embodiments, before the initial buffer layer is formed, the method for manufacturing the semiconductor structure includes the following operation.

An initial bonding layer is formed on a surface of the first dielectric layer and an inner wall of the first trench.

In some embodiments, the initial bonding layer includes a bonding material, and the bonding material includes at least one or any combination of silicon oxide, silicon nitride, silicon carbonitride, or silicon oxynitride.

In the embodiments of the disclosure, the bonding material is deposited on the surface of the first dielectric layer and the inner wall of the first trench by any suitable deposition method, such as an atomic layer deposition process, to form the initial bonding layer.

As shown in FIG. 4C, the bonding material is deposited on the surface of the first dielectric layer 404 and the inner wall of the first trench A1 to form the initial bonding layer 405a, in which the first trench A1 is not fully filled with the initial bonding layer 405a.

The initial buffer layer includes a buffer material with a smaller elastic modulus. After the initial bonding layer is formed, a buffer material is deposited on a surface of the initial bonding layer to form an initial buffer layer. The buffer material includes at least one or any combination of an organic material, an inorganic material, or a composite material.

As shown in FIG. 4D, the buffer material is deposited on the surface of the initial bonding layer 405a to form the initial buffer layer 406a, in which the first trench A1 is not fully filled with the initial buffer layer 406a.

Figure 4E:
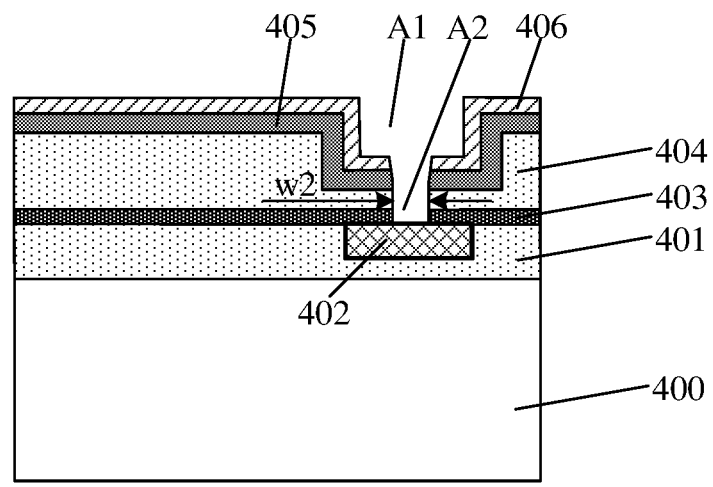

Next, with reference to FIG. 4E, S303 is executed. At S303, a portion of the initial buffer layer and a portion of the first dielectric layer at a bottom of the first trench are removed to form a second trench penetrating through the first dielectric layer, and a buffer layer.

In some embodiments, S303 may be implemented by the following operations.

A portion of the initial buffer layer, a portion of the initial bonding layer, a portion of the first dielectric layer, and a portion of the initial etch stop layer at a bottom of the first trench are removed to form a second trench penetrating through the first dielectric layer and the initial etch stop layer.

A portion of the initial buffer layer 406a, a portion of the initial bonding layer 405a, a portion of the first dielectric layer 404, and a portion of the initial etch stop layer 403a at the bottom of the first trench A1 are removed to form a second trench A2 penetrating through the first dielectric layer and the initial etch stop layer, as shown in FIG. 4E. An opening dimension of the second trench A2 is w2, and the opening dimension w2 of the second trench A2 is less than the opening dimension w1 of the first trench A1. A remaining portion of the initial buffer layer, a remaining portion of the initial bonding layer, and a remaining portion of the initial etch stop layer form the buffer layer 406, the bonding layer 405, and the etch stop layer 403, respectively.

In the embodiments of the disclosure, the formation of the first trench and the second trench uses the Damascene process, which will not increase the additional photomask cost compared with the related art.

Figure 4F:
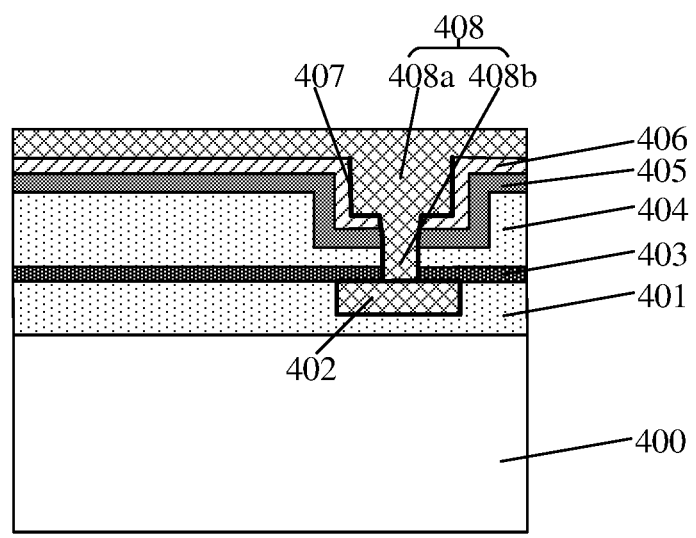
Figure 4G:
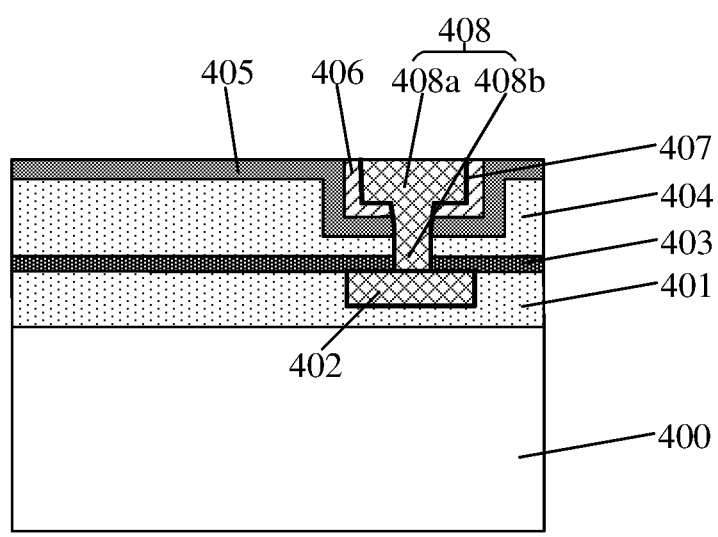

Next, with reference to FIG. 4F and FIG. 4G, S304 is executed. At S304, a metal material is filled in the first trench and the second trench to form a top metal layer.

In some embodiments, the top metal layer includes a first top metal layer located in the first trench, and a second top metal layer located in the second trench. S304 may be implemented by the following operations.

At S3041, on an inner wall of the first trench, and an inner wall of the buffer layer, an inner wall of the bonding layer and an inner wall of the first dielectric layer in the second trench, a barrier layer and a seed layer are formed successively.

At S3042, the metal material is electroplated on a surface of the seed layer to form the first top metal layer and the second top metal layer.

In the embodiments of the disclosure, the seed layer may be a seed crystal of a metal material, and the seed layer may be deposited by PVD.

As shown in FIG. 4E and FIG. 4F, on the inner wall of the buffer layer 406 and the inner wall of the bonding layer 405 in the first trench A1 and the inner wall of the first dielectric layer 404 and the inner wall of the etch stop layer 403 in the second trench A2, a barrier layer 407 and a seed layer (not shown) are formed successively. A first top metal layer 408a in the first trench A1 and a second top metal layer 408b in the second trench A2 are formed on a surface of the seed layer. The first top metal layer 408a and the second top metal layer 408b jointly form a top metal layer 408, and the second top metal layer 408b is connected to a bottom metal layer 402.

At S3043, the first top metal layer and the buffer layer are planarized until a surface of the bonding layer is exposed.

In the embodiments of the disclosure, the top metal layer 408 is planarized through Chemical Mechanical Polishing (CMP) until a surface of the bonding layer 405 is exposed, to form the semiconductor structure as shown in FIG. 4G.

The method for manufacturing the semiconductor structure in the embodiments of the disclosure is similar to the semiconductor structure in the foregoing embodiments. For the technical features which are not disclosed in detail in the embodiments of the disclosure, please refer to the foregoing embodiments for understanding, and details are not described herein again.

According to the method for manufacturing the semiconductor structure provided by the embodiments of the disclosure, the buffer layer located between the top metal layer and the first dielectric layer may be formed by means of a simple deposition process, and the buffer layer can effectively adapt to transverse expansion caused by diffusion of the top metal layer in the bonding process of the semiconductor structures, thus preventing delamination between the semiconductor structures. In addition, according to the embodiments of the disclosure, the bonding strength between the semiconductor structures can be improved through the buffer layer, and the planarization requirement on the bonding interface is reduced. Therefore, the manufacturing process difficulty of the semiconductor structure is also reduced.

Figure 5:
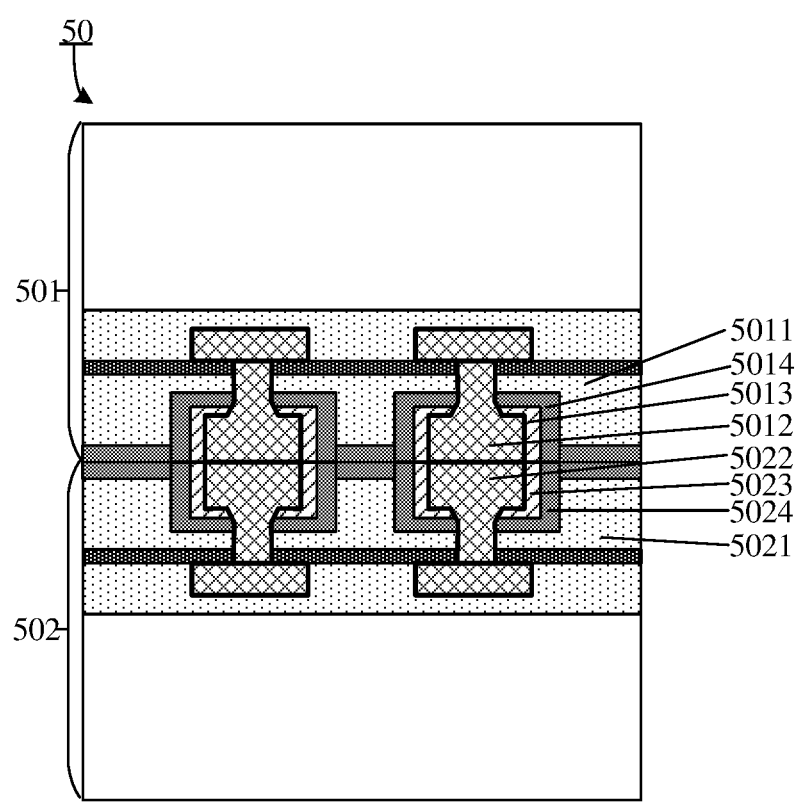
FIG. 5 is a schematic diagram of a stacked structure according to an embodiment of the disclosure.

The embodiments of the disclosure provide a stacked structure. FIG. 5 is a schematic diagram of a stacked structure according to an embodiment of the disclosure. As shown in FIG. 5, the stacked structure 50 includes a first wafer 501 and a second wafer 502 stacked onto one another. The first wafer 501 includes a top metal layer 5012 located in a first dielectric layer 5011, a buffer layer 5013 located between the top metal layer 5012 and the first dielectric layer 5011, and a bonding layer 5014 located between the buffer layer 5013 and the first dielectric layer 5011. The second wafer 502 includes a top metal layer 5022 located in a first dielectric layer 5021, a buffer layer 5023 located between the top metal layer 5022 and the first dielectric layer 5021, and a bonding layer 5024 located between the buffer layer 5023 and the first dielectric layer 5021.

According to the embodiments of the disclosure, in the stacked structure 50, the top metal layer 5012 of the first wafer 501 is aligned with the top metal layer 5022 of the second wafer 502, the buffer layer 5013 of the first wafer 501 is aligned with the buffer layer 5023 of the second wafer 502, and the bonding layer 5014 of the first wafer 501 is aligned with the bonding layer 5024 of the second wafer 502.

In the embodiments of the disclosure, each of the first wafer 501 and the second wafer 502 is provided with the semiconductor structure described in the foregoing embodiments. For the technical features which are not disclosed in detail in the embodiments of the disclosure, please refer to the foregoing embodiments for understanding, and details are not described herein again.

According to the stacked structure provided by the embodiments of the disclosure, since the top metal layer, the buffer layer, and the bonding layer of the first wafer are completely aligned with the top metal layer, the buffer layer, and the bonding layer of the second wafer, respectively, the bonding strength between the two wafers can be improved, thereby improving the stability of the stacked structure.

Figure 6:
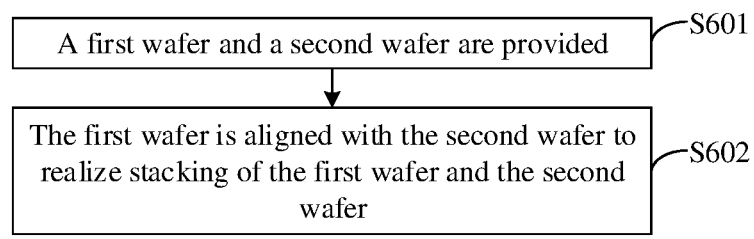
FIG. 6 is a schematic flowchart of a wafer stacking method according to an embodiment of the disclosure.

In addition, the embodiments of the disclosure further provide a wafer stacking method. FIG. 6 is a schematic flowchart of a wafer stacking method according to an embodiment of the disclosure. As shown in FIG. 6, the stacking method includes the following operations.

At S601, a first wafer and a second wafer are provided.

In the embodiments of the disclosure, each of the first wafer and the second wafer is provided with the semiconductor structure described in the foregoing embodiments. For example, the first wafer and the second wafer each include a top metal layer located in a first dielectric layer, a buffer layer located between the top metal layer and the first dielectric layer, and a bonding layer located between the buffer layer and the first dielectric layer. The first dielectric layer is located on a surface of the first wafer and a surface of the second wafer respectively.

At S602, the first wafer is aligned with the second wafer to realize stacking of the first wafer and the second wafer.

In some embodiments, S602 may be implemented by the following operations.

At S6021, the top metal layer, the buffer layer, and the bonding layer of the first wafer are aligned with the top metal layer, the buffer layer, and the bonding layer of the second wafer respectively, to realize the stacking of the first wafer and the second wafer.

The method for manufacturing the stacked structure in the embodiments of the disclosure is similar to the stacked structure in the foregoing embodiments. For the technical features which are not disclosed in detail in the embodiments of the disclosure, please refer to the foregoing embodiments for understanding, and details are not described herein again.

According to the stacking method provided by the embodiments of the disclosure, during the bonding process of the first wafer and the second wafer, since the top metal layer, the buffer layer, and the bonding layer of the first wafer are completely aligned with the top metal layer, the buffer layer, and the bonding layer of the second wafer, respectively, the bonding strength between the two wafers can be improved, thereby improving the stability of the formed stacked structure.

In the several embodiments provided in the disclosure, it should be understood that the disclosed device and method may be implemented in a non-target way. The described device embodiments are merely exemplary. For example, the division of units is merely division in logical functions and may be realized in other ways in actual implementation. For example, multiple units or components may be combined with each other, or integrated into another system, or some features may be omitted or skipped. Furthermore, the coupling or direct coupling among the components illustrated or discussed herein may be implemented.

The units described as separate components may or may not be physically separate. Components illustrated as units may be or may not be physical units; they may be located in one place, or distributed on multiple network units. Some or all of the units may be selected to realize the purpose of a solution of the embodiments as needed.

Features disclosed in several method or device embodiments provided in the disclosure may be combined arbitrarily to form a new method or device embodiment without conflict.

The above are merely some implementations of embodiments of the disclosure, which are not intended to limit the scope of protection of the embodiments of the disclosure. Any modification or replacement easily made by the persons skilled in the art within the technical scope disclosed by the embodiments of the disclosure shall fall within the scope of protection of the embodiments of the disclosure. Therefore, the scope of protection of the disclosure shall be subject to the scope of protection of the claims.

The invention claimed is:

1. A semiconductor structure, comprising:
a semiconductor substrate;
a first dielectric layer on a surface of the semiconductor substrate;
a top metal layer, wherein the top metal layer is located in the first dielectric layer, and the top metal layer penetrates through the first dielectric layer;
a buffer layer located between the top metal layer and the first dielectric layer, wherein a material of the buffer layer is different from a material of the first dielectric layer;
a bonding layer, located between the buffer layer and the first dielectric layer, and between the top metal layer and the first dielectric layer; and
a barrier layer located on an outer side wall and a bottom of the top metal layer, wherein the barrier layer is located between the buffer layer and the top metal layer, between the bonding layer and the top metal layer, and between the first dielectric layer and the top metal layer.

2. The semiconductor structure of claim 1, wherein the material of the buffer layer comprises at least one or any combination of an organic material, an inorganic material, or a composite material.

3. The semiconductor structure of claim 2, wherein the first dielectric layer comprises a first trench and a second trench communicating with each other, and an opening dimension of the first trench is greater than an opening dimension of the second trench, and
the top metal layer comprises a first top metal layer located in the first trench, and a second top metal layer located in the second trench.

4. The semiconductor structure of claim 3, wherein a top surface of the buffer layer is flush with a top surface of the first top metal layer.

5. The semiconductor structure of claim 1, wherein the bonding layer comprises a bonding material, and the bonding material comprises at least one or any combination of silicon oxide, silicon nitride, silicon carbonitride, or silicon oxynitride.

6. The semiconductor structure of claim 1, wherein a bonding strength of the buffer layer is greater than a bonding strength of the bonding layer.

7. The semiconductor structure of claim 1, wherein an elastic modulus of the buffer layer is less than an elastic modulus of the bonding layer.

8. The semiconductor structure claim 3, wherein the semiconductor structure further comprises a second dielectric layer on the surface of the semiconductor substrate and a bottom metal layer located in the second dielectric layer, and the first dielectric layer is located on the second dielectric layer, and
the bottom metal layer is connected to the second top metal layer.

9. The semiconductor structure of claim 8, wherein the semiconductor structure further comprises an etch stop layer located between the first dielectric layer and the second dielectric layer, and
the second trench penetrates through the etch stop layer.

10. A method for manufacturing a semiconductor structure, comprising:
providing a semiconductor substrate, wherein a first dielectric layer is formed on a surface of the semiconductor substrate, the first dielectric layer comprises a first trench, and a depth of the first trench is less than a thickness of the first dielectric layer;
forming an initial bonding layer on the surface of the first dielectric layer and the inner wall of the first trench;
forming an initial buffer layer on a surface of the initial bonding layer, wherein a material of the initial buffer layer is different from a material of the first dielectric layer;
removing a portion of the initial buffer layer, a portion of the initial bonding layer, and a portion of the first dielectric layer at a bottom of the first trench to form a second trench penetrating through the first dielectric layer, wherein a remaining portion of the initial buffer layer and a remaining portion of the initial bonding layer form a buffer layer and a bonding layer, respectively; and filling a metal material in the first trench and the second trench to form a top metal layer; and, wherein the barrier layer is located between the buffer layer and the top metal layer, between the bonding layer and the top metal layer, and between the first dielectric layer and the top metal layer;

the top metal layer comprises a first top metal layer located in the first trench and a second top metal layer located in the second trench, and filling the metal material in the first trench and the second trench to form the top metal layer comprises:

successively forming a barrier layer and a seed layer on an inner wall of the buffer layer and an inner wall of the bonding layer in the first trench and an inner wall of the first dielectric layer in the second trench;

electroplating the metal material on a surface of the seed layer to form the first top metal layer and the second top metal layer; and planarizing the first top metal layer and the buffer layer until a surface of the bonding layer is exposed.

11. The method of claim 10, wherein before forming the first dielectric layer, the method further comprises:

forming a second dielectric layer on the surface of the semiconductor substrate;

forming a bottom metal layer in the second dielectric layer; and forming an initial etch stop layer on a surface of the second dielectric layer and a surface of the bottom metal layer, wherein a second top metal layer is connected to the bottom metal layer, and the initial etch stop layer is located between the first dielectric layer and the second dielectric layer.

12. The method of claim 11, wherein the method comprises:

when removing the portion of the initial buffer layer, the portion of the initial bonding layer, and the portion of the first dielectric layer at the bottom of the first trench, removing a portion of the initial etch stop layer at the bottom of the first trench, so that the second trench penetrates through the initial etch stop layer, wherein a remaining portion of the initial etch stop layer forms an etch stop layer.

13. A stacked structure, comprising: a first wafer and a second wafer stacked onto one another, wherein each of the first wafer and the second wafer is at least provided with the semiconductor structure according to claim 1, and the top metal layer of the first wafer is aligned with the top metal layer of the second wafer, the buffer layer of the first wafer is aligned with the buffer layer of the second wafer, and a bonding layer of the first wafer is aligned with a bonding layer of the second wafer.

14. The stacked structure of claim 13, wherein a bonding strength of the buffer layer is greater than a bonding strength of the bonding layer.

15. The stacked structure of claim 13, wherein an elastic modulus of the buffer layer is less than an elastic modulus of the bonding layer.

16. A wafer stacking method, comprising:

providing a first wafer and a second wafer each provided with the semiconductor structure according to claim 1; and aligning the first wafer with the second wafer to realize stacking of the first wafer and the second wafer.

17. The method of claim 16, wherein each of the first wafer and the second wafer comprises the top metal layer located in the first dielectric layer, the buffer layer located between the top metal layer and the first dielectric layer, and a bonding layer located between the buffer layer and the first dielectric layer, and the first dielectric layer is located on a surface of the first wafer and a surface of the second wafer respectively, and wherein aligning the first wafer with the second wafer to realize stacking of the first wafer and the second wafer comprises:

aligning the top metal layer, the buffer layer, and the bonding layer of the first wafer with the top metal layer, the buffer layer, and the bonding layer of the second wafer respectively, to realize stacking of the first wafer and the second wafer.

* * * * *